(12) United States Patent
Barth et al.

(10) Patent No.: US 7,755,196 B2
(45) Date of Patent: Jul. 13, 2010

(54) METHOD FOR PRODUCTION OF AN INTEGRATED CIRCUIT BAR ARRANGEMENT, IN PARTICULAR COMPRISING A CAPACITOR ASSEMBLY, AS WELL AS AN INTEGRATED CIRCUIT ARRANGEMENT

(75) Inventors: Hans-Joachim Barth, Munich (DE); Jurgen Holz, Dresden (DE)

(73) Assignee: Infineon Technologies AG, Munich (DE)

( * ) Notice: Subject to any disclaimer, the term of this patent is extended or adjusted under 35 U.S.C. 154(b) by 85 days.

(21) Appl. No.: 11/857,944

(22) Filed: Sep. 19, 2007

(65) Prior Publication Data

US 2008/0006905 A1    Jan. 10, 2008

Related U.S. Application Data

(60) Division of application No. 11/181,574, filed on Jul. 14, 2005, now Pat. No. 7,285,490, which is a continuation of application No. PCT/EP03/14974, filed on Dec. 31, 2003.

(30) Foreign Application Priority Data

Jan. 15, 2003    (DE) ................................. 103 01 243

(51) Int. Cl.
*H01L 23/48*    (2006.01)
(52) U.S. Cl. ................ 257/758; 257/499; 257/E23.079; 257/E23.144
(58) Field of Classification Search .................. 257/499, 257/E23.144
See application file for complete search history.

(56) References Cited

U.S. PATENT DOCUMENTS

| | | | |
|---|---|---|---|
| 5,914,279 A | 6/1999 | Yang et al. | |
| 5,933,719 A | 8/1999 | Nii et al. | |
| 6,027,861 A | 2/2000 | Yu et al. | |
| 6,027,980 A | 2/2000 | Gardner | |
| 6,037,255 A | 3/2000 | Hussein et al. | |
| 6,078,088 A * | 6/2000 | Buynoski | 257/410 |
| 6,107,136 A | 8/2000 | Melnick et al. | |
| 6,143,649 A | 11/2000 | Tang | |
| 6,376,386 B1 | 4/2002 | Oshima | |

(Continued)

FOREIGN PATENT DOCUMENTS

DE    100 57 444    5/2002

(Continued)

OTHER PUBLICATIONS

Office Action from the German Patent Office dated Oct. 2, 2003 with non-certified English translation.

(Continued)

*Primary Examiner*—Lex Malsawma
(74) *Attorney, Agent, or Firm*—Brinks Hofer Gilson & Lione

(57) ABSTRACT

A method for production of an integrated circuit arrangement which contains a capacitor. A dielectric layer is structured with the aid of a two-stage etching process, and with the aid of a hard mask. In the case of an electrically insulating hard mask, the hard mask is removed again. In the case of an electrically conductive hard mask, parts of the hard mask may remain in the circuit arrangement.

7 Claims, 4 Drawing Sheets

U.S. PATENT DOCUMENTS

| | | | |
|---|---|---|---|
| 2001/0052613 A1 | 12/2001 | Higashi et al. | |
| 2002/0000665 A1* | 1/2002 | Barr et al. | 257/758 |
| 2002/0098673 A1 | 7/2002 | Yeh et al. | |
| 2002/0173163 A1 | 11/2002 | Gutsche | |
| 2003/0008490 A1 | 1/2003 | Xing et al. | |
| 2003/0064582 A1 | 4/2003 | Oladeji et al. | |

FOREIGN PATENT DOCUMENTS

| | | |
|---|---|---|
| EP | 0 680 085 A1 | 4/1995 |
| EP | 1 001 459 A3 | 5/2000 |

OTHER PUBLICATIONS

German Office Action dated Aug. 27, 2007.

English translation of German Office Action dated Aug. 27, 2007.

\* cited by examiner

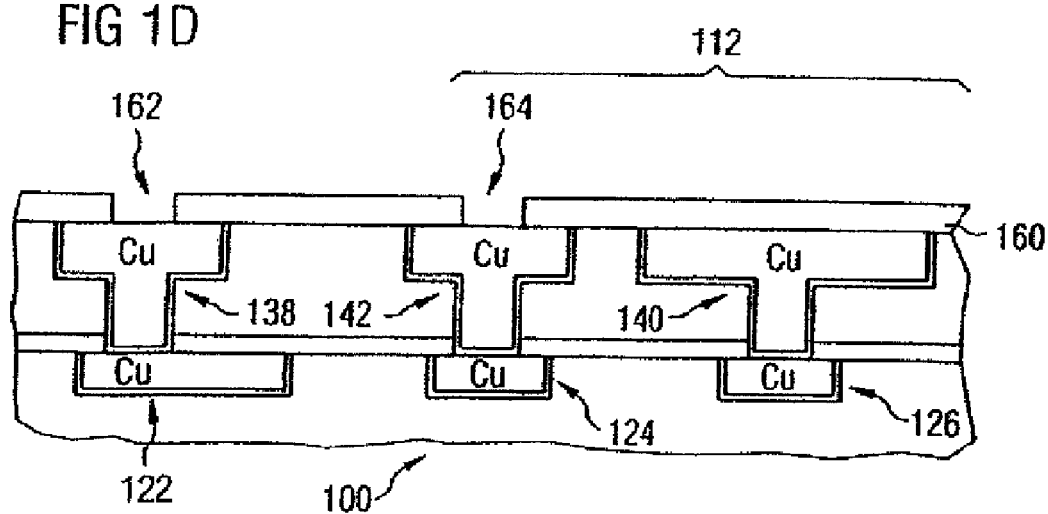
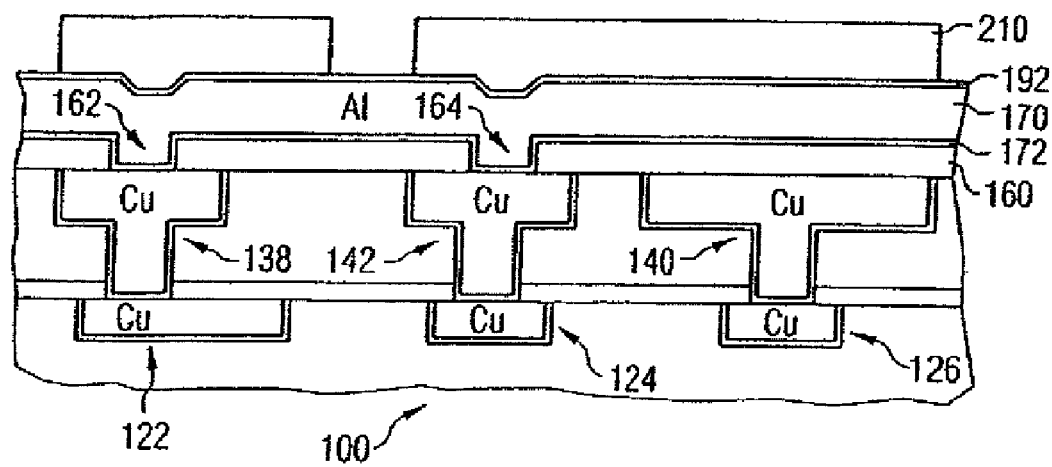

METHOD FOR PRODUCTION OF AN INTEGRATED CIRCUIT BAR ARRANGEMENT, IN PARTICULAR COMPRISING A CAPACITOR ASSEMBLY, AS WELL AS AN INTEGRATED CIRCUIT ARRANGEMENT

This application is a divisional application of application Ser. No. 11/181,574 filed Jul. 14, 2005, which is continuation of POT patent application No. PCT/EP03/014974, filed Dec. 31, 2003, which claims the benefit of priority to German Patent Application DE 10301243.5, filed Jan. 15, 2003, both of which are incorporated herein by reference.

TECHNICAL FIELD

The invention relates to integrated circuit arrangements and to methods for production of integrated circuits.

BACKGROUND

One method of producing an integrated circuit arrangement includes the application of a dielectric layer to an electrode layer which contains at least one electrode. Followed by application of a resist layer, structuring of the dielectric layer, and removing residues of the resist layer.

At a temperature of 20° C., the dielectric layer has an electrical resistivity of, for example, more than $10^{10}$ Ωcm or even $10^{16}$ Ωcm. By way of example, silicon dioxide is used as the material for the dielectric layer. However, materials with a dielectric constant of more than 3.9 are also used, for example silicon nitride, aluminum oxide or tantalum pentoxide.

In contrast, the electrode layer contains a highly conductive material which has an electrical resistivity of less than $10^{-4}$ Ωcm, for example. However, the electrical resistivity is usually one or more orders of magnitude less than this value. Examples for materials in the electrode layer are aluminum, aluminum alloys, copper, copper alloys, silver, titanium or other metals or compounds such as tantalum nitride TaN or titanium nitride TiN.

By way of example, the resist layer could be removed once the dielectric layer has been completely structured with the aid of the resist layer. However, this has the disadvantage that, during the removal of the resist, parts of the electrode layer are exposed and are thus attacked by the chemical processes which are used to remove the resist. The removal of the photoresist is carried out, for example, by carbonization at a temperature of about 200° C. and subsequent removal of the ash using a solvent. Alternatively, it is possible to remove the photoresist just by means of a wet-chemical process.

By way of example, the material of the electrode layer may be oxidized. The oxidation products which are produced in this way must be removed again by means of a specific cleaning step. This cleaning step must be specifically developed and optimized, in particular when specific oxides must be removed, for example copper oxides. If the reaction products which are produced during removal of the resist on the electrode layer are not removed completely, then this leads to high contact resistances, resulting in a deterioration in the reliability of the electrically conductive connections.

Furthermore, the chemical compounds which are produced during removal of the resist in the area of the exposed regions of the electrode layer also penetrate under the dielectric layer. Underetching thus occurs during removal of the reaction products, making the electrical characteristics of the integrated circuit arrangement considerably worse. For this reason as well, considerable funds must be invested in the development of the cleaning step.

BRIEF SUMMARY

A simple method for production of an integrated circuit arrangement, in particular with a capacitor arrangement, is provided which can be carried out in particular without any additional cleaning step, or with a very simple cleaning step. A circuit arrangement and/or a capacitor arrangement is provided which can be produced easily and which, in particular, has excellent electrical characteristics.

The invention is based on the idea that it is necessary to avoid removal of the resist when areas of the electrode layer are exposed.

Therefore, in the method according to the invention, at least one hard mask layer is applied to the dielectric layer. The hard mask layer is composed, for example, of an oxide or of some other material which can be etched selectively with respect to the dielectric layer located directly underneath it during the structuring of contact holes or so-called vias. The etching is in this case preferably dry etching. However, wet etching is also used in order to produce contact holes or vias. The contact hole or the via is, however, not opened completely by this etching process, that is to say the dielectric layer is not etched through. The resist is then removed, for example by means of so-called resist stripping. During this process, the electrodes in the electrode layer are still protected by the dielectric layer.

Further etching for complete structuring of the dielectric layer with the aid of the hard mask layer is not carried out until this has been done. During this etching process, the dielectric layer is removed in the area of the contact holes or vias, thus opening the contact hole or via, in the process exposing an area, which is located underneath it, of at least one electrode in the electrode layer. The hard mask layer replaces the function of the resist, which is no longer present, during this etching process. The second etching process is, for example, dry etching or wet etching.

In a first alternative of the method according to the invention, the layer of the hard mask layer which is adjacent to the dielectric layer is an electrically insulating layer, which is removed again once the contact holes or vias have been produced. The etching process which is required for this purpose is selective with respect to the dielectric layer located underneath it and also does not significantly attack the exposed areas of the electrode layer, in particular during wet etching. In order to prevent damage to the dielectric layer as a result of plasma effects, wet-chemical etching is preferably carried out in the first alternative, although dry etching can also be used for complete removal of the hard mask layer.

In another alternative of the method according to the invention, the layer of the hard mask layer which is adjacent to the dielectric layer is an electrically conductive layer. The electrically conductive layer remains in places on the dielectric layer and thus forms a part of an electrode which is immediately adjacent to the dielectric layer. Since the electrically conductive layer need not be removed in the electrode area, the dielectric layer is not attacked or damaged in this area by an etching process, either.

The two alternatives of the method according to the invention thus offer two simple options for production of the integrated circuit arrangement. In particular, less development effort is required since there is no need to carry out any complicated cleaning step by means of which reaction products must be removed from areas of the electrode layer with these reaction products being produced during removal of the resist with exposed electrodes in the electrode layer. The method can be carried out easily because the contact hole etching or via etching is carried out in only two steps, with the resist being removed between the two steps. A layer which can be deposited easily is used as the hard mask, and is then used for structuring of the contact holes or of the vias. The hard mask layer can also, if necessary, be removed selectively and protectively with respect to the dielectric layer located underneath it. For example, a CVD oxide layer may be used as the hard mask layer, as is used as the intermetal dielectric in metallization layers.

In a development of the first alternative of the method according to the invention, the electrically insulating layer of the hard mask layer is removed wet-chemically. Wet-chemical etching attacks the dielectric layer located under the hard mask layer to a lesser extent than dry etching which is carried out, for example, with the aid of a plasma as chemical/physical dry etching.

In one refinement, the electrically insulating layer is etched with oxygen being excluded, in particular using an inert gas atmosphere, for example a nitrogen gas atmosphere. This measure prevents oxidation of the exposed areas of the electrode layer during removal of the hard mask layer. These measures mean that no reaction products are formed, particularly no oxidation products, on the exposed areas or between electrode areas and the dielectric layer in the area around the exposed areas. There is therefore no need to remove these reaction products, with the underetching associated with this.

If, in a next refinement, the electrically insulating layer is removed completely, then no further lithography process is required since etching can be carried out over the entire surface.

In a development of the method according to the invention based on the second alternative, a remaining part of the electrically conductive layer is designed as part of the cover electrode of a capacitor or of some other component, for example a bonding connecting electrode. Particularly in the case of capacitors, the quality of the dielectric layer is subject to very stringent requirements. In particular, the dielectric layer must not be etched by etching processes. This is ensured by the remaining areas of the electrically conductive layer.

In a next development of the method according to the invention, the hard mask layer contains, as in the second alternative, an electrically conductive layer which is adjacent to the dielectric layer, and an electrically insulating layer located above it. After the structuring of the dielectric layer, the electrically insulating layer is removed. The electrically conductive layer remains in places, and with the original or a reduced layer thickness in the integrated circuit arrangement. This development allows a wider process window in comparison to a method in which the hard mask layer contains only one electrically conductive layer. Furthermore, this development makes it possible to choose the thickness of the electrically conductive layer over a wider range. In particular, the electrically conductive layer may be designed to be thinner than is the case in a method in which the hard mask layer contains only one electrically conductive layer.

In a next development with a hard mask layer which contains an electrically conductive layer and an electrically insulating layer, the electrically insulating layer is removed wet-chemically, dry-chemically or chemically/physically. There is no need to be concerned about damage to the dielectric layer during this process, since the electrically conductive layer protects the dielectric layer. In a refinement, the electrically conductive layer is used as an etching stop layer during the removal of the electrically insulating layer. It is possible to carry out an etching method with end point detection or else a time-controlled etching method.

In a next development of the method according to the invention, at least one trench is produced before the application of the dielectric layer. The dielectric layer is also applied to the base of the trench. This measure is used in particular when using a copper material in an upper electrode layer which is to be produced above the electrode layer. Specifically, a so-called Damascene or a dual Damascene method is used for producing the copper metallization. During etching of the trenches, the dielectric layer is not damaged, because it is not produced until after the trench has been formed.

In a next development, the hard mask layer is composed of an oxide layer, in particular of a silicon dioxide layer. However, hard mask layers composed of titanium or titanium nitride, or of some other suitable material, are also used.

In another development, the dielectric layer is composed of silicon nitride, of silicon carbide, of aluminum oxide or of some other material with a high dielectric constant. High dielectric constants are dielectric constants of more than 3.9. Examples of materials such as these are aluminum nitride, hafnium dioxide, tantalum pentoxide, zirconium dioxide, barium strontium titanate and lead zirconium titanate. However, there are also other suitable materials with high dielectric constants.

In a next development, the electrode layer is composed of a material which would be attacked during removal of the resist layer without any additional measures, in particular copper, a copper alloy, silver or a silver alloy. The electrode layer material which can be attacked is located directly on the dielectric layer in one refinement.

In another development, a further electrode layer, which contains at least one electrode, is produced after the structuring of the dielectric layer. In one refinement, the electrode is composed of aluminum, of an aluminum alloy, of copper or of a copper alloy. However, electrodes are also produced from other materials. In one refinement, the alloys contain additives of less than 5 percent by mass.

In a next development, the two electrode layers to which the dielectric layer is adjacent are in the form of metallization layers with a large number of interconnects. Capacitors with a high area capacitance can be produced between such metallization layers, if the distance between the adjacent surfaces of electrodes of different metallization layers is less than 150 nm, or even less than 100 nm.

In another development of the method, the structured residues of the resist layer are removed using a method which is not the same as the method for structuring of the dielectric layer. In consequence, the residues of the resist layer are not removed solely by means of the varnish removal which is unavoidable during etching of the hard mask.

A further aspect of the invention relates to a circuit arrangement as claimed in patent claim 13, in particular to a circuit arrangement which has been produced using the second alternative of the method according to the invention, or its developments.

In one development of the circuit arrangement according to the invention, the thickness difference of liner layers of the remaining hard mask and in apertures in the remaining hard mask is greater than 30 nm. The thickness difference is thus greater than the thickness difference resulting solely from non-conformal deposition of a layer in the aperture.

BRIEF DESCRIPTION OF THE DRAWINGS

Exemplary embodiments of the invention will be explained in the following text with reference to the attached drawings, in which:

FIGS. 1A to 1F illustrate method steps during the production of an integrated circuit arrangement having a capacitor in accordance with an embodiment of the invention.

DETAILED DESCRIPTION

Figure 1A:
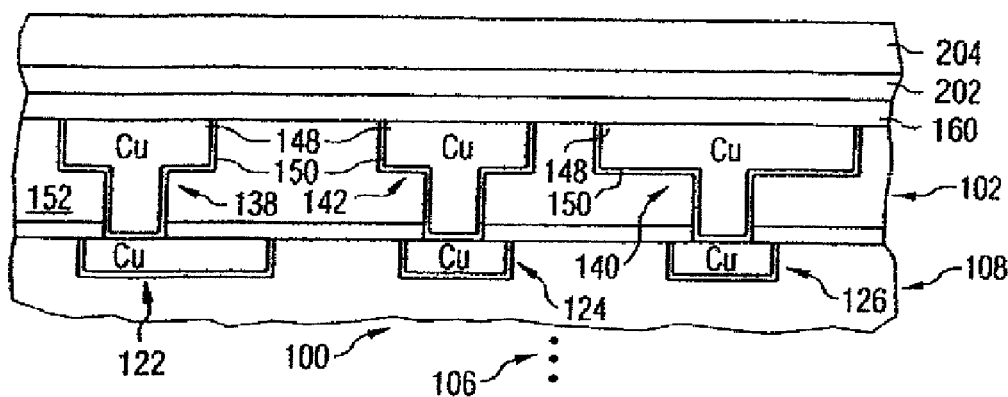
Figure 1B:
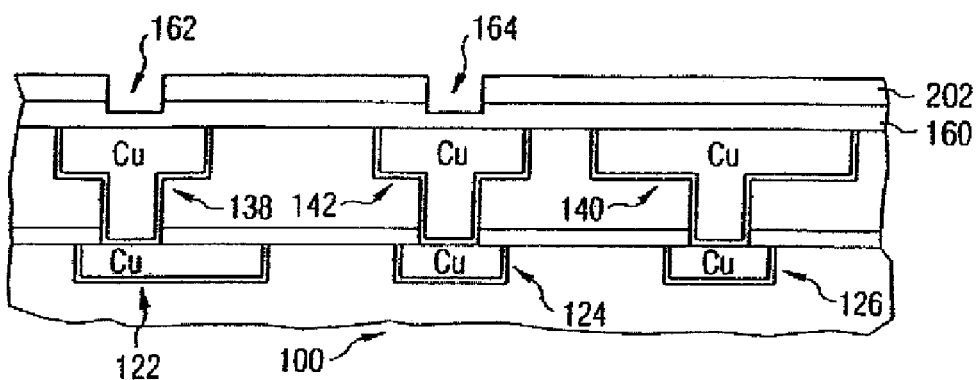
Figure 1C:
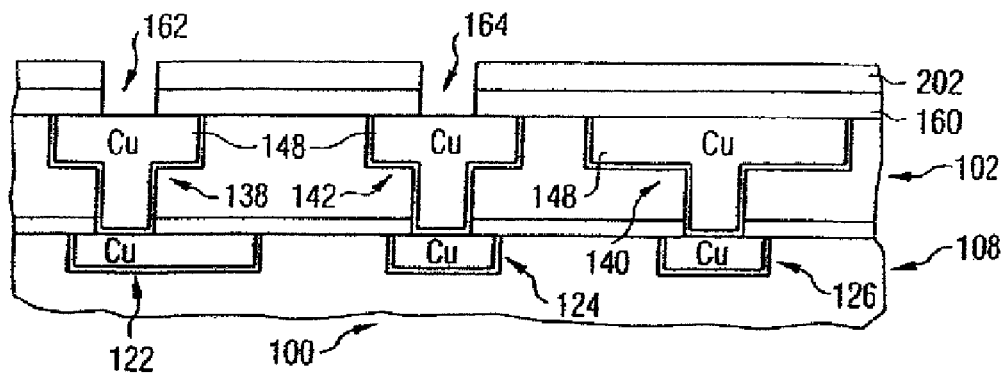
Figure 1F:
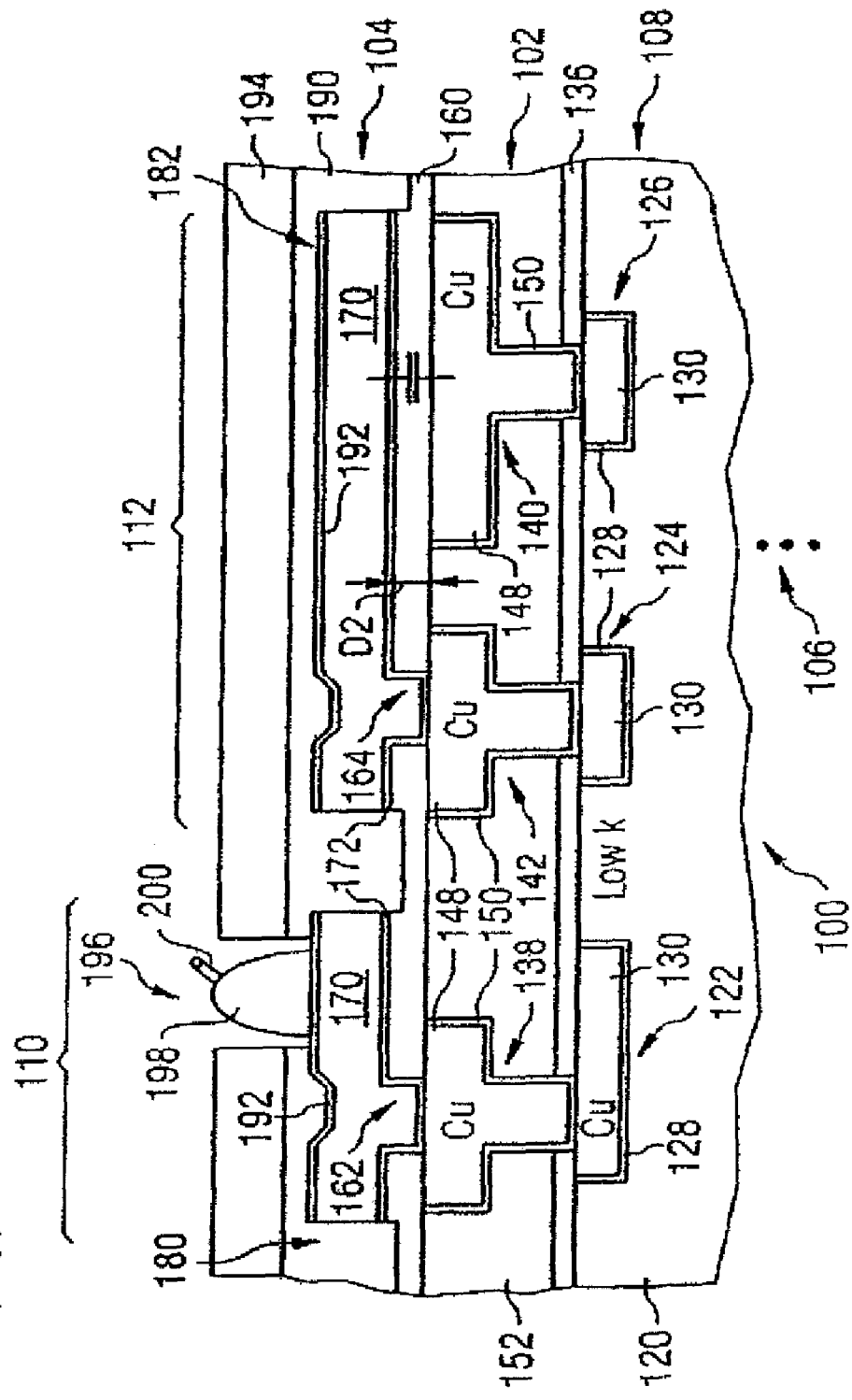

FIG. 1F shows a circuit arrangement 100 with a penultimate metallization layer 102 and a last metallization layer 104. A metallization layer 108 is located under the penultimate metallization layer 102. Metallization layers 106 which are arranged under the metallization layer 108, and a substrate of the circuit arrangement 100, are indicated by dots.

FIG. 1F shows a bonding connection 110 and a linear capacitor 112 as examples of components which may be arranged in the two uppermost metallization layers 102 and 104.

The metallization layer 108 contains as the insulating material a material having a low dielectric constant k (BLOK—Barrier LOw K), for example SILK (Silicon LOw K), that is to say for example porous silicon dioxide 120. Alternatively, FSG (Fluoride Silicate Glass) is used as the insulating material in the metallization layer 108. In the area of the bonding connection 110, the metallization layer 108 contains an interconnect 122. The interconnect 122 contains a liner/barrier layer 128 and copper 130. The barrier layer 128 is composed, for example, of titanium nitride. Underneath the capacitor 112, the metallization layer 108 contains interconnects 124 and 126, which lead to components which are connected to the capacitor 112.

A barrier layer 136 composed, for example, of silicon nitride is located between the metallization layer 108 and the metallization layer 102 and has a thickness of less than 20 nm, for example a thickness of 15 nm. Alternatively, in BLOK material (Barrier LOw K) is also used, for example silicon carbide.

In the area of the bonding connection 110, the metallization layer 102 contains a line 138 which leads from the interconnect 122 to the bonding connection 110. In the right-hand area of the capacitor 112, the metallization layer 102 contains a lower electrode 104 of the capacitor 112. The lower electrode 140 is connected to the interconnect 126. In the left-hand area of the capacitor 112, the metallization layer 102 contains a connection section 142, which is connected to the interconnect 124.

The line 138, the lower electrode 140 and the connection section 142 are formed by copper 148, which is separated by a liner/barrier layer 150 from the silicon dioxide 152 which is contained in the metallization layer 102 for isolation between the individual connections. The liner/barrier layer 150 is composed, for example, of titanium nitride.

An intermediate layer 160 with a thickness D2 of approximately 100 nm is located between the metallization layer 102 and the metallization layer 104. The intermediate layer 160 is composed completely, for example, of silicon nitride.

A via or contact hole 162 passes through the intermediate layer 160 in the area of the bonding connection 110, and is generally referred to as a via because it is located between two metallization layers. In the area of the capacitor 112, a via or contact hole 164 passes through the intermediate layer 160, and leads to the connection section 142. The contact holes or vias 162 and 164 are filled with aluminum 170. A liner/barrier layer 172, for example composed of titanium nitride, separates the aluminum 170 from the intermediate layer 160 and from the copper in the metallization layer 102. The liner/barrier layer 172 improves the adhesion and prevents diffusion processes. The liner/barrier layer 172 also prevents or reduces electromigration of aluminum. Except for the apertures for the contact holes 162 and 164 and for further contact holes which are not illustrated, the intermediate layer 160 is formed over the entire surface in the area between the metallization layers 102 and 104.

In the area of the bonding connection 110, the metallization layer 104 contains a connecting plate 180 composed of aluminum 170. In the area of the capacitor 112, the metallization layer 104 contains an upper electrode 182 of the capacitor 112 composed of aluminum 170. The upper electrode 182 is connected via the contact hole 164 and covers the entire lower electrode 140.

The metallization layer 104 contains silicon dioxide 190 for isolation between the connecting plate 180 and the upper electrode 182. Structured residual areas of a liner/antireflection layer 192 which, inter alia, prevents electromigration, are located on the upper surfaces of the connecting plate 180 and of the upper electrode 182. The metallization layer 104 is covered by a passivation layer 194 which, for example, is composed of silicon nitride.

In the area of the bonding connection 110, there is a cutout 196 in the passivation layer 194 and in the silicon dioxide 190. The cutout 196 ends at the connecting plate 180. The connecting head 198 of a bonding wire 200 is located in the cutout 196.

The following method steps are carried out in order to produce the circuit arrangement 100:

Production of the lower metallization layers 106, 108 and 102 from copper, see FIG. 1A:

The lower metallization layers 106, 108 and 102 are produced by copper deposition or by deposition of a copper alloy in a material with a low dielectric constant k using, for example, the Damascene technique or the dual Damascene technique. Furthermore, the interconnect 122 and a large number of contact holes, that is to say a so-called "sea of vias", are arranged underneath the bonding connection 110 in order to provide, inter alia, mechanical robustness.

The silicon dioxide 152 or some other material, for example FSG (Fluoride Silicate Glass), is applied and is structured using a lithography process. The liner/barrier layer 150 and the copper 148 are then deposited.

The liner/barrier layer 150 and the copper 148 are then removed to approximately the same level as the silicon dioxide 152 with the aid of a chemical/mechanical polishing method (CMP). The surface is then cleaned, for example using a cleaning process assisted by brushes (brush clean).

After this, the intermediate layer 160 is produced, which is used as the dielectric and as the barrier layer. For example, the following variants can be used for production of the intermediate layer 160:

a) Approximately 100 nm of silicon nitride is deposited as the dielectric diffusion barrier, and as the intermetal dielectric for the uppermost metallization layer 104, for example with the aid of a CVD method (Chemical Vapor Deposition), with the aid of a PECVD method (Plasma Enhanced CVD), or else with the aid of ALD methods (Atomic Layer Deposition).

b) First of all, a layer of less than 20 nm of silicon nitride is deposited using an HDP method (High Density Plasma). This silicon nitride layer is solidified by the additional ion bombardment during this process, thus offering optimum reliability against electromigration of the copper 148. After this, a so-called pre-clean is carried out. Approximately 80 nm of silicon nitride is then deposited with the aid of a PECVD method, with the deposition process preferably being interrupted a number of times in order to produce a multilayer stack, which offers optimum dielectric strength.

c) First of all, a silicon nitride layer with a thickness of less than 20 nm is deposited on the cleaned metallization layer 102 using an HDP method. This layer offers optimum reliability against electromigration. Approximately 80 nm of a dielectric with a high dielectric constant k is then deposited, in order to achieve a maximum area-related capacitance. Suitable materials include, among others, aluminum oxide $Al_2O_3$ or tantalum pentoxide $Ta_2O_5$, which are preferably deposited using an ALD method (Atomic Layer Deposition) or, in the case of tantalum pentoxide, by anodization, that is to say by application of tantalum with subsequent oxidation.

d) Approximately 80 nm or approximately 100 nm of aluminum oxide ($Al_2O_3$) is deposited as the intermetal dielectric for the uppermost metallization layer 104.

e) A layer stack composed of approximately 15 nm of $Al_2O_3$, approximately 30 nm of $Ta_2O_5$ and approximately 15 nm of $Al_2O_3$ is deposited.

f) Alternatively, different materials with a high dielectric constant k are used, for example aluminum nitride AlN, hafnium dioxide $HfO_2$, tantalum pentoxide $Ta_2O_5$, zirconium dioxide $ZrO_2$, BST (Barium Strontium Titanate), PZT (Lead Zirconium Titanate). In developments, a thin layer of, for example, 20 nm of silicon nitride SiN or silicon carbide SiC is arranged as a copper barrier underneath these materials.

Contact Hole Production (Via), Also See FIG. 1A:

An oxide layer 202 is applied as a hard mask layer to the intermediate layer 160, for example with a thickness of 100 nm (nanometers) and using a PECVD method. After this, a photoresist layer 204 is applied, and is exposed and developed to correspond to the structures for the contact holes 162 and 164.

In a first etching step, the contact holes 162 and 164 are etched into the oxide layer 202, being stopped by time control or by end point detection on or in the intermediate layer 160, see FIG. 1B.

The residues of the photoresist layer 204 are removed, for example wet-chemically.

As is illustrated in FIG. 1C, the second step for etching the intermediate layer 160, in order to expose the copper 148 in the area of the contact holes 162 and 164, is then carried out before the intermediate layer 160 has been completely structured but with the photoresist layer 204 already having been removed.

As is shown in FIG. 1D, the oxide layer 202, which is used as a hard mask, is then removed, using wet-chemical etching, in order to avoid damaging the intermediate layer 106, particularly in the area of the capacitor 112, or to damage it only to a negligible extent. In order to prevent the copper 148 from being oxidized in the area of the contact holes 162 and 164, the etching process is carried out in an inert gas atmosphere, for example in a nitrogen or argon atmosphere. Hydrofluoric acid HF is suitable, for example, as the etching bath. The etching system that is used is commercially available.

Production of the Metallization Layer 104, See FIG. 1E:

The barrier layer 172 is deposited, with sputter pre-cleaning or reactive pre-cleaning, for example based on hydrogen, being carried out. Suitable materials for the metallic diffusion barrier are Ta, TaN, Ti, TiN, W, WN, etc. Suitable deposition methods are the PVD method (Physical Vapor Deposition) or the CVD method.

The aluminum 170 or an aluminum alloy, for example AlCu with less than 5 percent by mass of copper, is deposited with the aid of a PVD method or with the aid of a CVD method, in particular in the contact holes 162 and 164 as well. Other layer stacks are also used for the metallization of the final metallization layer 104.

The liner/antireflection layer 192 is deposited, for example a titanium nitride layer, which is deposited with the aid of a PVD method.

With a photoresist layer 210 being applied, a lithography process is carried out in order to structure the aluminum 170 as well as the layers 172 and 192, with the position of the connecting plate 180 and of the upper electrode 182 being defined.

The liner/antireflection layer 192, the aluminum 170 and the barrier layer 172 are etched, with the etching process being stopped at the upper surface of the intermediate layer 160. This etching process is sufficiently selective with respect to the intermediate layer 160, so that the remaining thickness of the intermediate layer 160 offers adequate protection against copper diffusion.

The photoresist is removed, and a cleaning step is carried out.

Final Passivation, See FIG. 1F:

The silicon dioxide 190 or some other suitable material, for example FSG, is deposited. The nitride layer 194 is then deposited.

With a further photoresist layer, which is not illustrated, being applied, a lithography process is carried out in order to define the position of the cutout 196, that is to say of the opening which leads to the connecting plate 180.

The cutout 196 is etched.

The remaining areas of the further photoresist layer are removed, and a cleaning step is carried out.

Optionally, the opening of the cutout 196 may also be produced with a photosensitive polyimide as a mask. The method as explained with reference to FIGS. 1A to 1F can also be carried out if a copper alloy, aluminum or an aluminum alloy is used instead of the copper in the metallization layer 102 or else in all of the lower metal layers. In this case, in particular, the variants for production of the intermediate layer 160 and the method steps for production of the structure located above it remain unchanged.

Copper or a copper alloy may also be used instead of the aluminum in the metallization layer 104. If one wishes to avoid the disadvantages that occur during etching of the copper, then the copper is structured using a dual Damascene technique, see FIG. 2.

Figure 2:
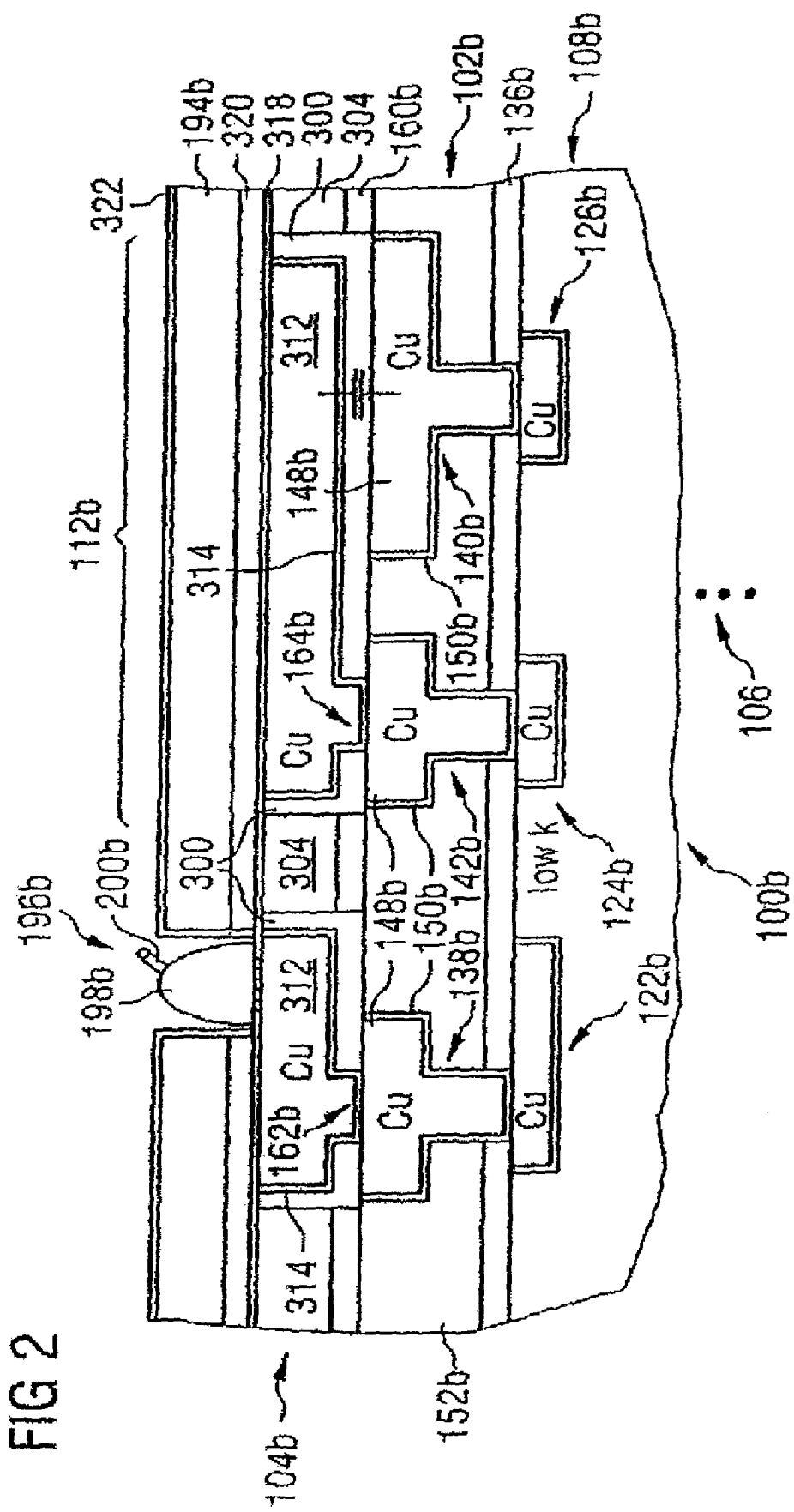
FIG. 2 illustrates a circuit arrangement having a capacitor manufactured using a different method in accordance with an alternative embodiment.

FIG. 2 shows a circuit arrangement 100b with a penultimate metallization layer 102b and a last metallization layer 104b, which both contain copper or a copper alloy. First of all, trenches were produced in the uppermost metallization layer 104b in the circuit arrangement 100b, for connection sections of the metallization layer 104b. After this, and only after this, an intermediate layer 300 was deposited, and contact holes 162b and 164b were produced. In FIG. 2, elements with the same structure and function as elements which have been explained with reference to FIGS. 1A to 1C are annotated by the same reference symbols, but with the reference symbols being followed by the lower-case letter b in order to distinguish them. These elements will not be explained once again, because the above explanations still apply.

There are discrepancies between FIG. 2 and FIGS. 1A to 1F which will become clear during the explanation of the method steps for production of the circuit arrangement 100b:

Production of the Lower Metallization Layers 106b, 108b and 102b:

Reference should be made to the statements relating to FIG. 2.

Production of a Barrier Layer 160b:

A barrier layer 106b with a thickness of more than 20 nm, for example of 50 nm, is deposited on the flattened metallization layer 102b with the aid, for example, of a PECVD method or with the aid of an HDP method. The barrier layer 160b is composed, for example, of silicon nitride or of a material with a low dielectric constant k (BLOK), for example silicon carbide.

Production of the Metallization Layer 104b, Trench Production:

An oxide layer, for example a silicon dioxide layer 304, is deposited on the barrier layer 160b. A different material may also be used as an alternative, for example FSG.

A lithography process is carried out in order to define the position for the trenches into which copper 312 will later be introduced.

The trenches are etched, with the process being stopped at the barrier layer 160b.

The photoresist is removed, in order to prevent oxidation of the copper.

The barrier layer 160b is etched through in the area of the trenches. In order to ensure that the regions of the barrier layer 160b above the copper 148b are removed completely, a certain amount of overetching must be carried out. This leads to deeper trenches in areas in which there is no copper 148b, but silicon dioxide 152b.

Variants for production of the intermediate layer 300: d, e, f) see variants d, e and f, respectively, relating to the production of the intermediate layer 160.

g) A silicon nitride layer is deposited with a thickness of more than 50 nm as a dielectric diffusion barrier and as an intermetal dielectric. The thickness of the dielectric is limited by the etching selectivity between the oxide layer/FSG and the silicon nitride. After the etching of the trench for the upper electrode 182a, an electrically reliable dielectric must remain in the area of the capacitor 112a.

h) First of all, a silicon nitride layer is deposited, with a thickness of less than 20 nm. An HDP method is used for this purpose, in order to achieve optimum reliability with respect to electromigration. A silicon nitride layer of more than 30 nm is then deposited using a PECVD method, preferably as a multilayer stack for optimum dielectric strength.

i) First of all, a silicon nitride layer with a thickness of less than 20 nm is deposited, using an HDP method. A layer with a thickness of more than 30 nm is then deposited, composed of a dielectric with a high dielectric constant k, for example $Al_2O_3$ or $Ta_2O_5$. This layer leads to a maximum area-related capacitance of the linear capacitor 112b and of block capacitors in the circuit arrangement 100b. In this case as well, the overall thickness of the intermediate layer 300 should be more than 50 nm. The minimum thickness of the intermediate layer 300 is limited by the etching selectivity between the oxide layer/FSG and the layer with the high dielectric constant k.

An oxide layer which is not illustrated but is used as the hard mask layer is then applied, for example a silicon dioxide layer with a thickness of 100 nm.

Production of Contact Holes (Vias):

The position of the contact holes 162b and 164b as well as further contact holes which are not illustrated is defined with the aid of a photoresist layer, which is likewise not illustrated but is applied to the oxide layer, and a lithography process.

The contact holes 162b and 164b are etched into the oxide layer which is used as the hard mask layer.

The photoresist is removed.

The contact holes 162b and 164b into the intermediate layer 160b are enlarged as far as the copper 148b with the aid of the oxide layer which is used as the hard mask layer.

The oxide layer is removed by a wet-chemical process which is selective with respect to the intermediate layer 160b, so that the intermediate layer 160b is not damaged, particularly in the area of the capacitor 112b.

Further Production of the Metallization Layer 104a:

A barrier layer 314 is deposited, for which purpose sputter pre-cleaning or reactive pre-cleaning (for example based on hydrogen) should be carried out. The barrier layer 314 is deposited, for example, with the aid of a PVD method or with the aid of a CVD method. The same materials can be used as those for the barrier layer 172.

A copper layer with growth nuclei is then deposited, for example by means of PVD methods or by means of CVD methods, or by means of a non-electrical method from a solution.

The copper 312 is introduced with the aid of a dual Damascene filling method, for example with the aid of an ECD method (Electro Chemical Deposition).

The copper 312 and the barrier layer 314 are removed outside the trenches, with the aid of a CMP method.

A barrier layer 318 is applied. The barrier layer 318 has a thickness of approximately 20 nm to approximately 30 nm. By way of example, silicon nitride is applied with the aid of a PECVD method, or with the aid of an HDP method. However, other materials may also be used, for example a barrier material with a low dielectric constant k (BLOK—Barrier low k).

Production of the Passivation:

The passivation is then produced, for example by application of the silicon dioxide layer 320 and of the silicon nitride layer 194b.

A lithography process is carried out in order to define the position of the cutout 196b.

The cutout 196b is etched, with the process being stopped at the barrier layer 318.

The photoresist is removed.

The barrier layer 318 is etched through in the area of the cutout 196b.

An extremely thin but dense dielectric layer 322 is deposited, for example with a thickness of less than 5 nm. An ALCVD method (Atomic Layer CVD) is used, for example, for deposition. Silicon nitride is suitable as the material. The dielectric layer 322 protects the copper connecting plate 162b against corrosion and oxidation. The dielectric layer 322 must, however, be sufficiently thin that bonding on the copper connecting plate 182b is nevertheless possible.

In other exemplary embodiments, a titanium layer which is used as a hard mask or a titanium nitride layer, having a thickness of 50 nm or 100 nm, for example, is used instead of the oxide layer 202 that is used as the hard mask. Alternatively, any other suitable conductive material may be used as the hard mask. The hard mask layer remains at least with a predetermined layer thickness and in at least one area in the integrated circuit arrangement 100 or 100b, in particular in the area of the capacitor 112 or 112b, respectively. By way of example, the remaining layer thickness is 40 nm.

In the method explained with reference to FIG. 1F, the electrically conductive hard mask layer is also structured during the structuring of the aluminum 170. By way of example, the liner/barrier layer 172 is applied with a thickness of 50 nm to the remaining electrically conductive hard mask layer. In another exemplary embodiment, an additional liner/barrier layer 172 is no longer applied.

In the method explained with reference to FIG. 2, the electrically conductive hard mask layer which is provided with openings for the contact holes 162b and 164b remains in the trenches for the copper 312. The liner/barrier layer 314 is applied to the hard mask layer, for example with a thickness of only 50 nm. In one refinement, no additional liner/barrier layer 314 is applied to the hard mask layer.

Those areas of the electrically conductive hard mask layer which are located outside the trenches for the copper 312 are removed during the CMP process together with those areas of the intermediate layer 300 which are located outside the trenches.

In other alternative exemplary embodiments, a hard mask layer is used which contains a lower electrically conductive layer and an electrically insulating layer located above it. By way of example, the hard mask layer contains a titanium layer or a titanium nitride layer with a thickness of, for example, 50 nm, and an oxide layer, located above it, with a thickness of, for example, 100 nm. Only the electrically insulating layer of the hard mask is removed, instead of the step for removal of the hard mask, in the processes explained with reference to FIGS. 1A to 1F and FIG. 2. In contrast, the electrically conductive layer of the hard mask is removed only in places during the subsequent structuring of the aluminum 170 or during the CMP process for planarization of the copper 312. The remaining areas of the hard mask layer have the same thickness as the original hard mask layer or are thinner than the original thickness of the hard mask layer. In these cases as well, the liner/barrier layers 172 and 314 may be provided or may be entirely omitted.

The capacitors 112 and 112b may, of course, also be connected from above with the aid of a bonding connection or wiring in the upper metallization layer.

In other exemplary embodiments, the upper metallization layer 104, 104b also contains interconnects for wiring of various components.

The methods and further exemplary embodiments which have been explained with reference to FIGS. 1A to 1F and with reference to FIG. 2 may also be used when the metallization layers 102 and 104, or 102b and 104b, are not so closely adjacent, that is to say, for example, when the distances between the interconnects in the metallization layers are several 100 nm.

The invention claimed is:

1. An integrated circuit arrangement comprising:
    a first electrode layer which contains at least one first electrode;
    a second electrode layer which contains at least one second electrode,
    a dielectric layer between the first electrode layer and the second electrode layer and having at least one aperture that passes through the dielectric layer to the at least one first electrode,
    wherein the second electrode layer includes a first electrically conductive layer overlying and adjacent to the dielectric layer but not within the at least one aperture, and a second electrically conductive layer overlying the first electrically conductive layer and extending into the at least one aperture and contacting the first electrode,
    wherein the second electrically conductive layer comprises a liner/barrier layer, and
    wherein the second electrode comprises an electrically conductive material different from the first electrically conductive layer and the second electrically conductive layer.

2. The circuit arrangement as claimed in claim 1, wherein the first electrically conductive layer comprises a material different from the second conductive layer, and wherein the first electrically conductive layer has a thickness different from the second electrically conductive layer.

3. The circuit arrangement as claimed in claim 1, wherein the first electrically conductive layer comprises a material different from the second conductive layer.

4. The circuit arrangement as claimed in claim 1, wherein the first electrically conductive layer has a thickness different from the second electrically conductive layer.

5. The circuit arrangement as claimed in claim 1, wherein a thickness difference between the combined thickness of the first electrically conductive layer and the second electrically conductive layer with respect to a thickness of the first electrically conductive layer is at least 20 nm.

6. The circuit arrangement as claimed in claim 1, wherein the circuit arrangement is produced using a method comprising:
    forming a dielectric layer on an electrode layer including at least one electrode, wherein the dielectric layer has a thickness of less than 150 nm and is in contact with the at least one electrode;
    applying at least one hard mask layer to the dielectric layer, wherein the at least one hard mask layer is configured to define a contact or via;
    applying a resist layer to the hard mask layer;
    structuring the hard mask layer using the resist layer, wherein the dielectric layer is not completely structured, and wherein a contact hole or a via is not completely opened;
    removing residues of the resist layer;
    after removing the residues of the resist layer, completing the structuring of the dielectric layer using the hard mask layer, and completely opening the contact hole or the via and exposing the at least one electrode in the electrode layer; and
    removing the hard mask layer, wherein the hard mask layer comprises an electrically insulating layer.

7. The circuit arrangement as claimed in claim 1, wherein the circuit arrangement comprises a capacitor arrangement.

* * * * *